(12) United States Patent
Fix et al.

(10) Patent No.: US 7,223,995 B2
(45) Date of Patent: May 29, 2007

(54) LOGIC COMPONENTS COMPRISING ORGANIC FIELD EFFECT TRANSISTORS

(75) Inventors: Walter Fix, Nuremberg (DE); Andreas Ullmann, Furth (DE); Jurgen Ficker, Erlangen (DE)

(73) Assignee: PolyIC GmbH & Co. KG, Furth (DE)

( * ) Notice: Subject to any disclaimer, the term of this patent is extended or adjusted under 35 U.S.C. 154(b) by 0 days.

(21) Appl. No.: 10/508,640

(22) PCT Filed: Mar. 14, 2003

(86) PCT No.: PCT/DE03/00843

§ 371 (c)(1),
(2), (4) Date: Apr. 18, 2005

(87) PCT Pub. No.: WO03/081671

PCT Pub. Date: Oct. 2, 2003

(65) Prior Publication Data

US 2005/0277240 A1    Dec. 15, 2005

(30) Foreign Application Priority Data

Mar. 21, 2002 (DE) ................. 102 12 640

(51) Int. Cl.
  *H01L 51/00* (2006.01)
(52) U.S. Cl. .................. 257/40; 438/99; 257/E51.007
(58) Field of Classification Search ............... 257/40, 257/E51.007; 438/99
See application file for complete search history.

(56) References Cited

U.S. PATENT DOCUMENTS

| 3,512,052 A | 12/1970 | MacIver et al. |
| 3,769,096 A | 10/1973 | Ashkin |
| 3,955,098 A | 5/1976 | Kawamoto |
| 4,302,648 A | 11/1981 | Sado et al. |
| 4,340,657 A | 7/1982 | Rowe |
| 4,442,019 A | 4/1984 | Marks |

(Continued)

FOREIGN PATENT DOCUMENTS

DE    33 38 597    5/1985

(Continued)

OTHER PUBLICATIONS

Kawase, T. et al., "Inkjet Printed Via-Hole Interconnections and Resistors for All-Polymer Transistor Circuits", Advanced Materials 2001, 13, No. 21, Nov. 2, 2001, pp. 1601-1605.

(Continued)

*Primary Examiner*—Andy Huynh
*Assistant Examiner*—Earl Taylor
(74) *Attorney, Agent, or Firm*—Carella Byrne et al.; Elliot M. Olstein; William Squire

(57) ABSTRACT

The invention makes it possible, for the first time, to produce, despite conventional p-type MOS technology, fast logical gates based on organic field effect transistors. This is primarily due to the early saturation effect of OFETs having very thin semi-conducting layers, and, furthermore, to the use of OFETs having specific properties as the organic logic components and to a novel layout of the circuit containing these logic components.

9 Claims, 5 Drawing Sheets

U.S. PATENT DOCUMENTS

| | | |
|---|---|---|
| 4,865,197 A | 9/1989 | Craig |
| 4,926,052 A | 5/1990 | Hatayama |
| 4,937,119 A | 6/1990 | Nickles et al. |
| 5,173,835 A | 12/1992 | Cornett et al. |
| 5,206,525 A | 4/1993 | Yamamoto et al. |
| 5,259,926 A | 11/1993 | Kuwabara et al. |
| 5,321,240 A | 6/1994 | Takahira |
| 5,347,144 A | 9/1994 | Garnier et al. |
| 5,364,735 A | 11/1994 | Akamatsu et al. |
| 5,395,504 A | 3/1995 | Hoffman et al. |
| 5,480,839 A | 1/1996 | Ezawa et al. |
| 5,486,851 A | 1/1996 | Gehner et al. |
| 5,502,396 A | 3/1996 | Desarzens et al. |
| 5,546,889 A | 8/1996 | Wakita et al. |
| 5,569,879 A | 10/1996 | Gloton et al. |
| 5,574,291 A | 11/1996 | Dodabalapur et al. |
| 5,578,513 A | 11/1996 | Maegawa |
| 5,580,794 A | 12/1996 | Allen |
| 5,625,199 A | 4/1997 | Baumbach et al. |
| 5,629,530 A | 5/1997 | Brown et al. |
| 5,630,986 A | 5/1997 | Miller |
| 5,652,645 A | 7/1997 | Jain |
| 5,691,089 A | 11/1997 | Smayling |
| 5,705,826 A | 1/1998 | Aratani et al. |
| 5,729,428 A | 3/1998 | Sakata et al. |
| 5,854,139 A | 12/1998 | Kondo et al. |
| 5,869,972 A | 2/1999 | Birch et al. |
| 5,883,397 A | 3/1999 | Isoda et al. |
| 5,892,244 A | 4/1999 | Tanaka et al. |
| 5,946,551 A | 8/1999 | Dimitrakopoulos et al. |
| 5,967,048 A | 10/1999 | Fromson et al. |
| 5,970,318 A | 10/1999 | Choi et al. |
| 5,973,598 A | 10/1999 | Beigel |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |
| 6,060,338 A | 5/2000 | Tanaka et al. |
| 6,072,716 A | 6/2000 | Jacobson et al. |
| 6,083,104 A | 7/2000 | Choi |
| 6,087,196 A | 7/2000 | Sturm et al. |
| 6,133,835 A | 10/2000 | De Leeuw et al. |
| 6,150,668 A | 11/2000 | Bao et al. |
| 6,197,663 B1 | 3/2001 | Chandross et al. |
| 6,207,472 B1 | 3/2001 | Callegari et al. |
| 6,215,130 B1 | 4/2001 | Dodabalapur |
| 6,221,553 B1 | 4/2001 | Wolk et al. |
| 6,251,513 B1 | 6/2001 | Hyatt |
| 6,284,562 B1 | 9/2001 | Batlogg et al. |
| 6,300,141 B1 | 10/2001 | Segal et al. |
| 6,321,571 B1 | 11/2001 | Themont et al. |
| 6,322,736 B1 | 11/2001 | Bao et al. |
| 6,329,226 B1 | 12/2001 | Jones et al. |
| 6,330,464 B1 | 12/2001 | Colvin et al. |
| 6,335,539 B1 | 1/2002 | Dimitrakopoulos et al. |
| 6,340,822 B1 | 1/2002 | Brown et al. |
| 6,344,662 B1 | 2/2002 | Dimitrakopoulos et al. |
| 6,362,509 B1 | 3/2002 | Hart |
| 6,384,804 B1 | 5/2002 | Dodabalapur et al. |
| 6,403,396 B1 | 6/2002 | Gudesen et al. |
| 6,429,450 B1 | 8/2002 | Mutsaers et al. |
| 6,498,114 B1 | 12/2002 | Amundson et al. |
| 6,517,955 B1 | 2/2003 | Takada et al. |
| 6,555,840 B1 | 4/2003 | Hudson et al. |
| 6,593,690 B1 | 7/2003 | McCormick et al. |
| 6,603,139 B1 | 8/2003 | Tessler et al. |
| 6,621,098 B1 | 9/2003 | Jackson et al. |
| 6,852,583 B2 | 2/2005 | Bernds et al. |
| 6,903,958 B2 | 6/2005 | Bernds et al. |
| 2002/0018911 A1 | 2/2002 | Bemius et al. |
| 2002/0022284 A1 | 2/2002 | Heeger |
| 2002/0025391 A1 | 2/2002 | Angelopoulos |
| 2002/0053320 A1 | 5/2002 | Duthaler |
| 2002/0056839 A1 | 5/2002 | Joo et al. |
| 2002/0068392 A1 | 6/2002 | Lee et al. |
| 2002/0130042 A1 | 9/2002 | Stiene |
| 2002/0170897 A1 | 11/2002 | Hall |
| 2002/0195644 A1 | 12/2002 | Dodabalapur et al. |
| 2003/0059967 A1 | 3/2003 | Henning et al. |
| 2003/0112576 A1 | 6/2003 | Brewer et al. |
| 2004/0002176 A1 | 1/2004 | Xu |
| 2004/0013982 A1 | 1/2004 | Jacobsen et al. |
| 2004/0026689 A1 | 2/2004 | Bernds et al. |
| 2004/0084670 A1 | 5/2004 | Tripsas et al. |
| 2004/0211329 A1 | 10/2004 | Funahata et al. |

FOREIGN PATENT DOCUMENTS

| | | |
|---|---|---|
| DE | 4243832 | 6/1994 |
| DE | 198 52 312 | 5/1999 |
| DE | 198 16 860 | 11/1999 |
| DE | 199 18 193 | 11/1999 |
| DE | 100 06 257 | 9/2000 |
| DE | 199 21 024 | 11/2000 |
| DE | 695 19 782 | 1/2001 |
| DE | 19933757 | 1/2001 |
| DE | 199 35 527 | 2/2001 |
| DE | 199 37 262 | 3/2001 |
| DE | 100 12204 | 9/2001 |
| DE | 100 33112 | 1/2002 |
| DE | 100 45 192 | 4/2002 |
| DE | 100 47 171 | 4/2002 |
| DE | 100 43204 | 4/2002 |
| DE | 100 58 559 | 5/2002 |
| DE | 100 61297 | 6/2002 |
| DE | 101 17 663 A1 | 10/2002 |
| DE | 101 20 687 | 10/2002 |
| DE | 102 19 905 | 12/2003 |
| EP | 0 108850 | 5/1984 |
| EP | 0 128 529 | 12/1984 |
| EP | 0 268 370 A2 | 5/1988 |
| EP | 0 268 370 A3 | 5/1988 |
| EP | 0 350 179 | 1/1990 |
| EP | 0 418504 | 3/1991 |
| EP | 0 442123 | 8/1991 |
| EP | 0460242 | 12/1991 |
| EP | 0 501 456 A2 | 9/1992 |
| EP | 0 501 456 A3 | 9/1992 |
| EP | 0 511807 | 11/1992 |
| EP | 0 528682 | 2/1993 |
| EP | 0685985 | 12/1995 |
| EP | 0 785 578 A2 | 7/1997 |
| EP | 0 785 578 A3 | 7/1997 |
| EP | 0 786820 | 7/1997 |
| EP | 0 615 258 B1 | 9/1998 |
| EP | 0716458 | 6/1999 |
| EP | 0 966 182 | 12/1999 |
| EP | 0962984 | 12/1999 |
| EP | 0 979715 | 2/2000 |
| EP | 0981165 | 2/2000 |
| EP | 0 989 614 A2 | 3/2000 |
| EP | 1 048 912 | 11/2000 |
| EP | 1 052 594 | 11/2000 |
| EP | 1 065 725 A2 | 1/2001 |
| EP | 1 065 725 A3 | 1/2001 |
| EP | 1 083 775 A1 | 3/2001 |
| EP | 1 102 335 A2 | 5/2001 |
| EP | 1 104 035 A2 | 5/2001 |
| EP | 1 103916 | 5/2001 |
| EP | 1 134 694 | 9/2001 |
| EP | 1 224 999 | 7/2002 |
| EP | 1 237 207 | 9/2002 |
| EP | 1 318 084 | 6/2003 |
| FR | 2793089 | 11/2000 |

| | | |
|---|---|---|
| GB | 723598 | 2/1955 |
| GB | 2 058 462 | 4/1981 |
| JP | 54069392 | 6/1979 |
| JP | 61001060 | 1/1986 |
| JP | 61167854 | 7/1986 |
| JP | 362065477 A | 3/1987 |
| JP | 05152560 | 6/1993 |
| JP | 05259434 | 10/1993 |
| JP | 05347422 | 12/1993 |
| JP | 08197788 | 8/1995 |
| JP | 09083040 | 3/1997 |
| JP | 09320760 | 12/1997 |
| JP | 10026934 | 1/1998 |
| JP | 2969184 B | 11/1999 |
| JP | 2001085272 | 3/2001 |
| WO | WO 93 16491 | 8/1993 |
| WO | WO 94/17556 | 8/1994 |
| WO | WO 95/06240 | 3/1995 |
| WO | WO 95/31831 | 11/1995 |
| WO | WO 96/02924 | 2/1996 |
| WO | WO 96/19792 | 6/1996 |
| WO | WO 97/12349 | 4/1997 |
| WO | WO 97/18944 | 5/1997 |
| WO | WO 98/18156 | 4/1998 |
| WO | WO 98/40930 | 9/1998 |
| WO | WO 99/07189 | 2/1999 |
| WO | WO 99/10929 | 3/1999 |
| WO | WO 99 10939 | 3/1999 |
| WO | WO 99 21233 | 4/1999 |
| WO | WO 99 30432 | 6/1999 |
| WO | WO 99 39373 | 8/1999 |
| WO | WO 99 40631 | 8/1999 |
| WO | WO 99/53371 | 10/1999 |
| WO | WO 99 54936 | 10/1999 |
| WO | WO 9954936 | 10/1999 |
| WO | WO 99/66540 | 12/1999 |
| WO | 198 51703 | 5/2000 |
| WO | WO 00/33063 | 6/2000 |
| WO | WO 00/36666 | 6/2000 |
| WO | WO 01/03126 | 1/2001 |
| WO | WO 01/06442 | 1/2001 |
| WO | WO 01/08241 | 2/2001 |
| WO | WO 01 15233 | 3/2001 |
| WO | WO 01/17029 | 3/2001 |
| WO | WO 01/17041 | 3/2001 |
| WO | WO 01/27998 | 4/2001 |
| WO | WO 01/46987 | 6/2001 |
| WO | WO 01/47044 A2 | 6/2001 |
| WO | WO 01/47044 A3 | 6/2001 |
| WO | WO 01 47045 | 6/2001 |
| WO | WO 01/73109 A2 | 10/2001 |
| WO | WO 01/73109 A3 | 10/2001 |
| WO | WO 02/05360 | 1/2002 |
| WO | WO 02/05361 | 1/2002 |
| WO | WO 02/15264 | 2/2002 |
| WO | WO 02 19443 | 3/2002 |
| WO | WO 02/19443 | 3/2002 |
| WO | WO 02/29912 | 4/2002 |
| WO | WO 02/43071 | 5/2002 |
| WO | WO 02/47183 | 6/2002 |
| WO | WO 02/065557 | 8/2002 |
| WO | WO 02/065557 A1 | 8/2002 |
| WO | WO 02/071139 | 9/2002 |
| WO | WO 02/071505 | 9/2002 |
| WO | WO 02/076924 | 10/2002 |
| WO | WO 02/091495 | 11/2002 |
| WO | WO 02/095805 A3 | 11/2002 |
| WO | WO 02/099907 | 12/2002 |
| WO | WO 02/99907 | 12/2002 |
| WO | WO 02/099908 | 12/2002 |
| WO | WO 03/046922 | 6/2003 |
| WO | WO 03/067680 | 8/2003 |
| WO | WO 03/069552 | 8/2003 |
| WO | WO 03/081671 | 10/2003 |
| WO | WO 03/095175 | 11/2003 |
| WO | WO 2004/032257 | 4/2004 |
| WO | WO 2004/042837 | 5/2004 |
| WO | WO 2004/042837 A2 | 5/2004 |
| WO | WO 2004/042837 A3 | 5/2004 |
| WO | WO 2004/7194 A2 | 6/2004 |
| WO | WO 2004/7194 A3 | 6/2004 |
| WO | WO 2004/047144 A2 | 6/2004 |
| WO | WO 2004/047144 A2 | 6/2004 |
| WO | WO 2004/047144 A3 | 6/2004 |
| WO | WO 2004/083859 | 9/2004 |
| WO | WO 00 79617 | 12/2004 |

OTHER PUBLICATIONS

Qiao, X. et al., "The FeCl3-doped poly3-alkithlophenes) in solid state", Elsevier Science, Synthetic Metals 122 (2001) pp. 449-454.
Garnier F et al:, "Vertical Devices Architecture By Molding Of Organic-Based Thin Film Transistor", Applied Physics Letters, American Institute Of Physics. XP000784120, Issn: 0003-6951 abbildung 2.
Collet J. et al:, 'Low Voltage, 30 NM Channel Length, Organic Transistors With a Self-Assembled Monolayer as Gate Insulating Films:, Applied Physics Letters. American Institute of Physics. New York, US, Bd 76, Nr. 14, Apr. 3, 2000, Seiten 1941-1943, XP000950589, ISSN:0003-6951, das ganze Dokument.
Hwang J D et al:, "A Vertical Submicron SIc thin film transistor", Solid State Electronics, Elsevier Science Publishers, Barking, GB, Bd. 38, NR. 2, Feb. 1, 1995, Seiten 275-278, XP004014040, ISSN:0038-1101, Abbildung 2.
Rogers J A et al:, "Low-Voltage 0.1 Mum Organic Transistors and Complementary Inverter Circuits Fabricated with a Low-Cost Form of Near-Field Photolithography", Applied Physics Letters, American Institute of Physics. New York, US, Bd. 75, Nr. 7, Aug. 16, 1999, Seiten 1010-1012, XP000934355, ISSN: 003-6951, das ganze Dokument.
"Short-Channel Field-Effect Transistor", IBM Technical Disclosure Bulletin, IBM Corp., New York, US, Bd. 32, Nr. 3A, Aug. 1, 1989, Seiten 77-78, XP000049357, ISSN:0018-8689, das ganze Dokument.
Redecker, M. et al., "Mobility enhancement through homogeneous nematic alignment of a liquid-crystalline polyfluorene", 1999 American Institute of Physics, Applied Physics Letters, vol. 74, No. 10, pp. 1400-1402.
Rogers, J. A. et al:, "Printing Process Suitable for Reel-to-Reel Production of High-Performance Organic Transistors and Circuits", Advanced Materials, VCH, Verlagsgeseilschaft, Weinheim, DE, Bd. 11, Nr. 9, Jul. 5, 1999, Seiten 741-745, P000851834, ISSN: 0935-9648, das ganze Dokument.
Miyamoto, Shoichi et al:, Effect of LDD Structure and Channel Poly-Si Thinning on a Gate-All-Around TFT (GAT) for SRAM's, IEEE Transactions on Electron Devices. vol. 46, No. 8, Aug. 1999.
Kumar, Anish et al:, "Kink-Free Polycrystalline Silicon Double-Gate Elevated-Channel Thin-Film Transistors", IEEE Transactions on Electron Devices, vol. 45, No. 12, Dec. 1998.
Chen, Shiao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.
Zangara L: "Metall Statt Halbleiter, Programmierung Von Embedded ROMS Ueber Die Metallislerungen", Elektronik, Franzis Verlag GMBH, Munchen, DE, Bd. 47, Nr. 16, Aug. 4, 1998, Seiten 52-55, XP000847917, ISSN: 0013-5658, Seite 52, rechtes Plate, Zeile 7-Seite 53, linke Spalte, Zeile 14; Abbildungen 1, 2.
Hergel, H. J.: "Pld-Programmiertechnologien", Elektronik, Franzis Verlag GMBH. Munchen, DE, Bd 41, Nr. 5, Mar. 3, 1992, Seiten 44-46, XP000293121, ISSN: 0013-5658, Abbildungen 1-3.
Forrest et al.: "The Dawn of Organic Electronics", IEEE Spectrum, Aug. 2000, Seiten 29-34, XP002189000, IEEE Inc., New York, US ISSN:0018-9235, Seite 33, rechte Spalte, Zelle 58-Seite 34, linke Spalte, Zeile 24; Abbildung 5.

Patent Abstracts of Japan, vol. 009, No. 274 (E-354), Oct. 31, 1985 & JP 60 117769 A (Fujitsu KK), Jun. 25, 1985 Zusammenfassung.

Zie Voor Titel Boek, de 2e Pagina, XP-002189001, PG 196-228.

Drury et al., "Low-Cost All-Polymer Integrated Circuits", American Institute of Physics, Applied Physics Letters, 1998, vol. 73, No. 1, pp. 108-110, Jul. 6, 1998.

Kuhlmann et al., "Terabytes in Plastikfolie", Organische Massenspeicher vor der Serienproduktion.

Garnier, F. et al, "All-Polymer Field-Effect Transistor Realized by Printing Techniques", Science, American Association for the Advancement of Science, US, vol. 265, Sep. 16, 1994, pp. 1684-1686.

Assadi A, et al:, Field-Effect Mobility of Poly (3-Hexylthiophene) Dept. of Physics and Measurement Technology, Received Mar. 3, 1988; accepted for Publication May 17, 1988.

Bao, Z. et al., "High-Performance Plastic Transistors Fabricated by Printing Techniques", Chem. Mater vol. 9, No. 6, 1997, pp. 1299-1301.

Hebner, T.R. et al., Ink-jet printing of doped polymers for organic light emitting devices:, American Institute of Physics, Applied Physics Letters, vol. 72, No. 5, Feb. 2, 1998, pp. 519-521.

Angelopoulos M et al, "In-Situ Radiation Induced Doping", Mol. Cryst. Liq. Cryst. 1990, vol. 189, pp. 221-225.

Dai, L. et al, Photochemical Generation of Conducting Pattersn in Polybutadiene Films:, Macromolecules, vol. 29, No. 1, 1996, pp. 282-287, XP 001042019, the whole document.

Roman et al., Polymer Diodes With High Rectification:, Applied Physics Letters, vol. 75, No. 21, Nov. 22, 1999.

Patent Abstracts of Japan, vol. 010, No. 137, May 21, 1986 (JP 361001060A).

Schoebel, "Frequency Conversion with Organic-On-Inorganic Heterostructured Diodes", Extended Abstracts of the International Conference on Solid State Devices and Materials, Sep. 1, 1997.

Braun D., et al, "Visible light emission from semiconducting polymer diodes", American Institute of Physics, Applied Physics Letters 58, May 6, 1991, pp. 1982-1984.

Yu, G. et al., "Dual-function semiconducting polymer devices: Light-emitting and photodetecting diodes", American Institute of Physics, Applied Physics Letter 64, Mar. 21, 1994, pp. 1540-1542.

Lucent Technologies, "Innovation marks significant milestone in the development of electronic paper", Cambridge, MA and Murray Hill, NJ, Nov. 20, 2000. XP-002209726.

Garnier et al., "Conjugated Polymers and Oligomers as Active Material For Electronic Devices", Synthetic Metals, vol. 28, 1989.

Gelinck, G.H. et al., "High-Performance All-Polymer Integrated Circuits", Applied Physics Letters, v. 77, 2000, pp. 1487-1489.

Zheng, Xiang-Yang et al., "Electrochemical Patterning of the Surface of Insulators with Electrically Conductive Polymers", J. Electrochem. Soc., v. 142, 1995, pp. L226-L227.

Lidzey, D. G. et al., "Photoprocessed and Micropatterned Conjugated Polymer LEDs", Synthetic Metals, V. 82, 1996, pp. 141-148.

Kobel W. et al., "Generation of Micropatterns in Poly (3-Methyl-Thiophene) Films Using Microlithography: A First Step in the Design of an All-Organic Thin-Film Transistor" Synthetic Metals, V. 22, 1988, pp. 265-271.

Rost, Henning et al., "All-Polymer Organic Field Effect Transistors", Proc. Mat. Week, CD, 2001, pp. 1-6.

Manuelli, Alessandro et al., "Applicability of Coating Techniques for the Production of Organic Field Effect Transistors", IEEE Polytronic 2002 Conference, 2002, pp. 201-204.

Ullman, A. et al., "High Performance Organic Field-Effect Transistors and Integrated Inverters", Mat. Res. Soc. Symp. Proc., v. 665, 2001, pp. 265-270.

Fix, W. et al., "Fast Polymer Integrated Circuits Based on a Polyfluorene Derivative", ESSDERC 2002, 2002, pp. 527-529.

Knobloch, A. et al., "Printed Polymer Transistors", Proc. Polytronic, v. 84, 2001, pp. 84-89.

Ficker, J. et al., "Dynamic and Lifetime Measurements of Polymer OFETS and Integrated Plastic Circuits," Proc. of SPIE, v. 466, 2001, pp. 95-102.

Clemens, W. et al., "Vom Organischen Transistor Zum Plastik-Chip," Physik Journal, v. 2, 2003, pp. 31-36.

Crone, B. et al, "Large-scale complementary Integrated circuits based on Organic transistors", Nature, vol. 403, Feb. 3, 2000, pp. 521.

Fix, W., et al., "Fast polymer integrated circuits", American Institute of Physics, Applied Physics Letters, vol. 81, No. 89, Aug. 2002, pp. 1735-1737.

Dodabalapur, A. et al., Organic smart pixels, American Institute of Physics, Applied Physics Letters, vol. 73, No. 2, Jul. 13, 1998, pp. 142-144.

Halls, J.J. M., et al., "Efficient photodiodes from interpenetrating polymer networks", Nature, vol. 376, Aug. 10, 1995, pp. 498-500.

Brown, A.R. et al., "Field-effect transistors made from solution-processed organic semiconductors", Elsevier Science, S.A., Synthetic Metals 88 (1997) pp. 37-55.

Brown, A.R., "Logic Gates Made from Polymer Transistors and Their Use in Ring Oscillators", Science, vol. 270, Nov. 10, 1995, pp. 972-974.

Klauk, H. et al., "Pentacene Thin Film Transistors and Inverter Circuits", 1997 International Exectron Devices Meeting Technical Digest, pp. 539-542, Dec. 1997.

Klauk, H. et al., "Fast Organic Thin Film Transistor Circuits", IEEE Electron Device Letters, vol. 20, No. 6, pp. 289-291.

Bao, Z. et al., "Organic and Polymeric Materials for the Fabrications of Thin Film Field-Effect Transistors", paper presented at the meeting of American Chemical Society, Division of Polymer Chemistry, XX, XX, Bd. 39, Nr. 1, Mar. 29, 1998, P001032497, ISSN: 0032-3934 das ganze Dokument.

Patent Abstracts of Japan, vol. 013, No. 444 (E-828), Oct. 5, 1989 & JP 01 169942 A (Hitachi Ltd), Jul. 5, 1989.

Kobel W. et al., "Generation of Micropatterns in Poly (3-Methyl-Thiophene) Films Using Microlithography: A First Step in the Design of an All-Organic Thin-Film Transistor" Synthetic Metals, v. 22, 1988, pp. 265-271.

Koezuka, H. et al., "Macromolecular Electronic Device", Mol. Cryst. Liq. Cryst. 1994, vol. 2555, pp. 221-230.

Lowe, J. et al., "Poly (3—(2—Acetoxyethyl)Thiophene): A Model Polymer for Acid-Catalyzed Lithography", Synthetic Metals, Elsevier Sequoia, Lausanne, CH, Bd. 85, 1997, Seiten 1427-1430.

Lu, Wen et al., "Use of Ionic Liquids for π-Conjugated Polymer Electrochemical Devices", Science, vol. 297, 2002, pp. 983-987/.

Oelkrug, D. et al., "Electronic spectra of self-organized oligothiophene films with 'standing' and 'lying' molecular units", Elsevier Science S.A., 1996, Thin Solid Films 284-270.

Sandberg, H. et al, "Ultra-thin Organic Films for Field Effect Transistors", SPIE vol. 4466, 2001, pp. 35-43.

Schrodner M. et al., "Plastic electronics based on Semiconducting Polymers", First International IEEE Conference on Polymers and Adhesives in Microelectronics and Photonics, Incorporating Poly, Pep & Adhesives in Electronics. Proceedings (Cat. No. 01TH8592), First International IEEE Conference on Polymers and Adhesives in Micr, Seitenn 91-94.

Shaheen, S.E., et al., "Low band-gap polymeric photovoltaic devices", Synthetic Metals, vol. 121, 2001, pp. 1583-1584.

Takashima, W. et al., Electroplasticity Memory Devices Using Conducting Polymers and Solid Polymer Electrolytes, Polymer International, Melbourne, 1992, pp. 249-253.

Velu, G. et al. "Low Driving Voltages and Memory Effect in Organic Thin-Film Transistors With A Ferroelectric Gate Insulator", Applied Physics Letters, American Institute of Physics, New York, Vo.l 79, No. 5, 2001, pp. 659-661.

Wang, Hsing et al., "Conducting Polymer Blends: Polythiophene and Polypyrrole Blends with Polystyrene and Poly(bisphenol A carbonate)", Macromolecules, 1990, vol. 23, pp. 1053-1059.

Wang, Yading et al., "Electrically Conductive Semiinterpenetrating Polymer Networks of Poly(3-octylthiophene)", Macromolecules 1992, vol. 25, pp. 3284-3290.

U.S. Appl. No. 10/508,737, filed Jan. 10, 2005, Adolf Bernds et al.

U.S. Appl. No. 10/517,750, filed Jun. 10, 2005, Wolfgang Clemens et al.

U.S. Appl. No. 10/523,216, filed jul. 14, 2005, Adolf Bernds.

U.S. Appl. No. 10/523,487, filed Aug. 26, 2005, Wolfgang Clemens et al.

U.S. Appl. No. 10/524,646, filed Sep. 2, 2005, Walter Fix et al.

U.S. Appl. No. 10/533,756, filed Jan. 13, 2006, Wolfgang Clemens et al.
U.S. Appl. No. 10/534,678, Nov. 10, 2005, Wolfgang Clemens et al.
U.S. Appl. No. 10/535,448, filed Sep. 19, 2005, W. Clemens et al.
U.S. Appl. No. 10/535,449, filed May 19, 2005, Walter Fix et al.
U.S. Appl. No. 10/344,926, filed Feb. 12, 2004, Adolf Bernds et al.
U.S. Appl. No. 10/541,815, filed Jul. 8, 2005, Axel Gertt et al.
U.S. Appl. No. 10/541,956, filed Oct. 31, 2005, Wolfgang Clemens et al.
U.S. Appl. No. 10/541,957, filed Feb. 2, 2006, Walter Fix et al.
U.S. Appl. No. 10/543,561, filed Apr. 17, 2006, Wolfgang Clemens et al.
U.S. Appl. No. 10/542,678, filed Dec. 27, 2005, Adolf Bernds et al.
U.S. Appl. No. 10/542,679, filed Jul. 19, 2005, Adolf Bernds et al.
Dai, L. et al,. "Conjugation of Polydienes by Oxidants Other Than Iodine", Elsevier Science S.A. Synthetic Metals 86 (1997) 1893-1894.
Dai, L. et al., "$I_2$-Doping of 1,4-Polydienes", Elsevier Science S.A., Synthetic Metals 69 (1995), pp. 563-566.
Brabec, C.J. et al, "Photoinduced FT-IR spectroscopy and CW-photocurrent measurements of conjugated polymers and fullerenes blended into a conventional polymer matrix", Solar Energy Materials and Solar Cells, 2000 Elsevier Science V.V., pp. 19-33.
Brabec, C.J. et al., "Photovoltaic properties of a conjugated polymer/methanofullerene composites embedded in a polystyrene matrix", Journal of Applied Physics, vol. 85, No. 9, 1999, pp. 6866-6872.
Chen, X.L. et al., "Morphological and Transistor Studies of Organic Molecular Semiconductors with Anisotropic Electrical Characteristics", American Chemical Society. 2001. Chem. Mater. 2001, 13, 1341-1348.

De Leeuw D.M. et al., "Polymeric integrated circuits and light-emitting diodes", Electron Devices Meeting, 1997. Technical Digest, International, Washington, DC, USA Dec. 7-10, 1997, New York, NY, USA, IEEE, US Dec. 7, 1997.
Fraunhofer Magazin- Polytronic Chips Von der Rolle, Apr. 2001, pp. 8-13.
Gosain, D.P., "Excimer laser crystallized poly-Si TFT's on plastic substrates", Second International Symposium on Laser Precision Microfabrication, May 16-18, 2001, Singapore, vol. 4426, pp. 394-400.
Harsanyi G. et al, "Polytronics for biogtronics:unique possibilities of polymers in biosensors and BioMEMS", IEEE Polytronic 2002 Conference, Jun. 23, 2002, pp. 211-215.
Hebner, T.R. et al., Ink-jet printing of doped polymers for organic light emitting devices:, American Institute of Physics, Applied Physics Letters, vol. 72, No. 5, Feb. 2, 1998, pp. 519-521.
International Search Report Aug. 26, 2004.
Written Opinion (In German) dated Nov. 12, 2004 for corresponding PCT application DE03/00843 citing Brown previously cited in a prior IDS filed Jan. 24, 2005 See attached IDS letter for relevancy.
Response to Written Opinion dated Jan. 12, 2005 (In German) See attached IDS letter for relevancy.

International Preliminary Examination Report dated Feb. 18, 2005 (In German) See attached IDS letter for relevancy Docs. D1 and D2 both cited in IDS filed Jan. 24, 2005.

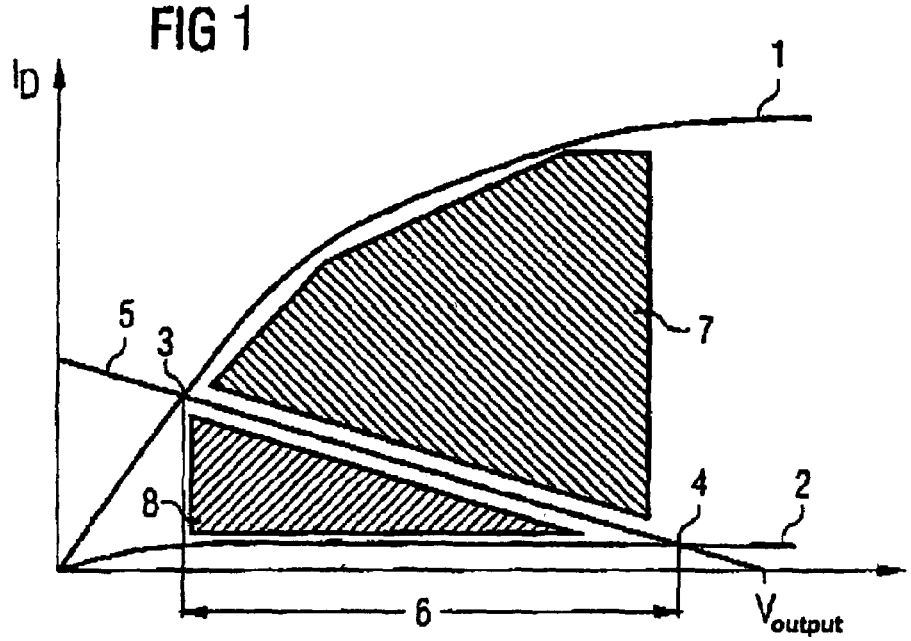
PRIOR ART
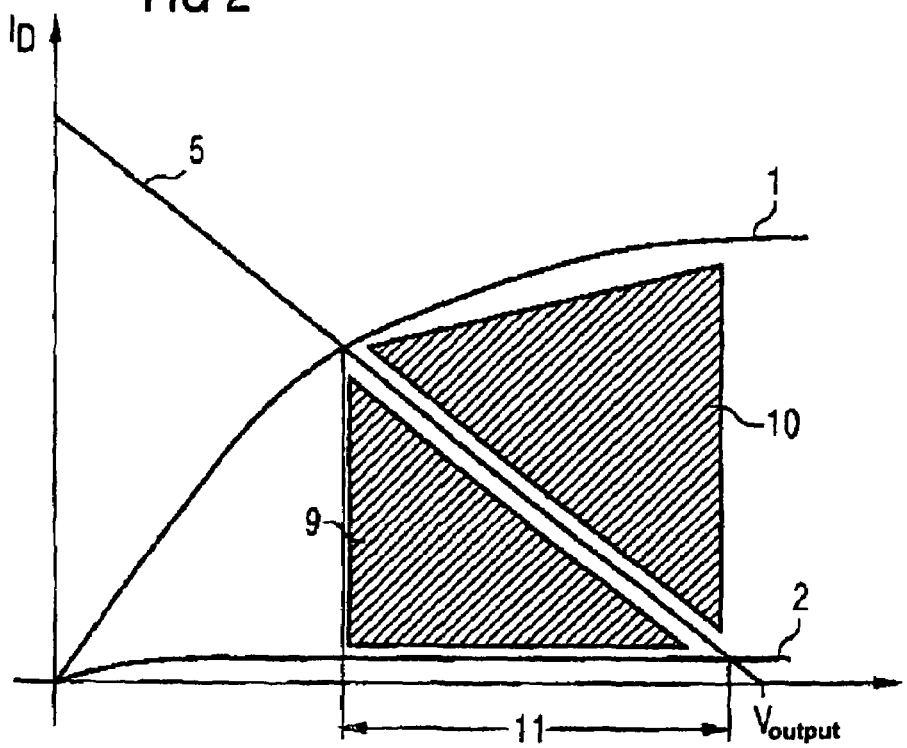
PRIOR ART

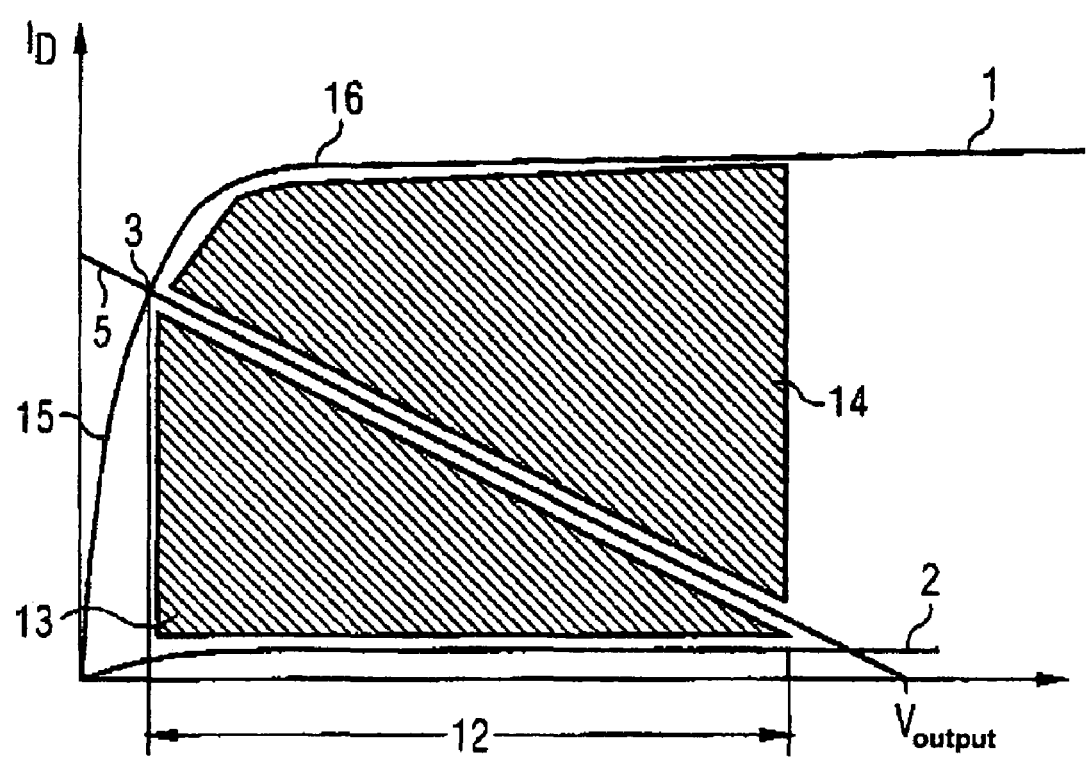

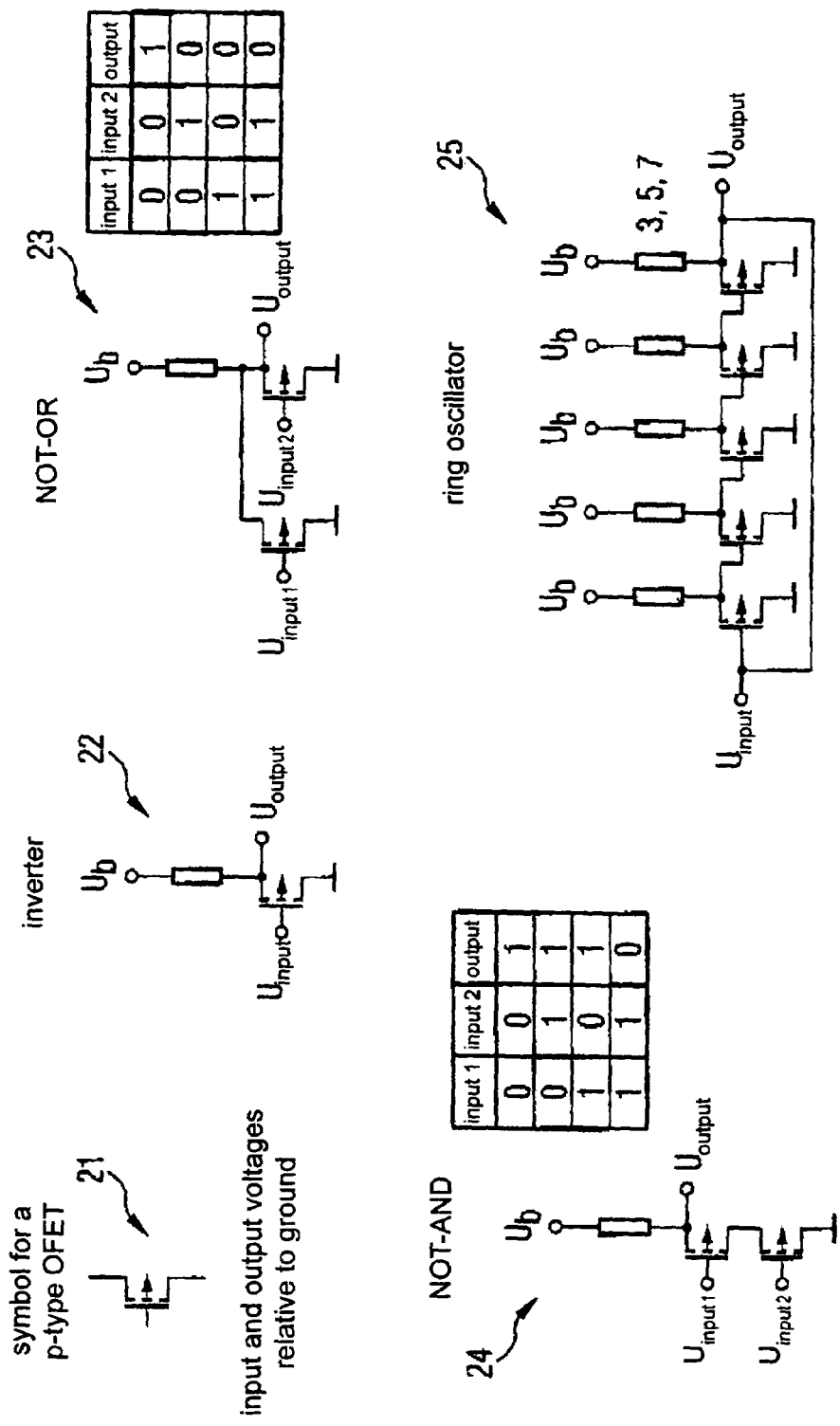

LOGIC COMPONENTS COMPRISING ORGANIC FIELD EFFECT TRANSISTORS

This application is a 371 of PCT/DE03/00843 filed on Mar. 14, 2003

The invention relates to logic components comprising organic field effect transistors, the switching speed of which is increased by replacing the resistors.

Logical gates such as NAND, NOR, or inverters are the elementary components of an integrated digital electronic circuit. The switching speed of the integrated circuit depends on the speed of the logical gates and not on the speed of the individual transistors. In conventional silicon semiconductor technology these gates are made using both n-type and p-type transistors and are thus very quick-acting. In the case of organic circuits this cannot be achieved because there are no adequately stable n-type semiconductors. This means that organic circuits have to include a conventional resistor instead of the n-type transistor.

A disadvantage of these logical gates made up of organic field effect transistors is that either they switch slowly (when the switching current, ie the integrals below the current voltage characteristic, differ considerably) or they cannot be switched off (when the voltage level difference in the current-voltage diagram is too small.

It is thus an object of the present invention to provide a logical gate made up of organic field effect transistors, in which the missing "classical" n-type transistors are replaced by components other than classical resistors.

The present invention relates to a logical gate comprising at least one first and one second organic field effect transistor (OFET), in which the first OFET is a p-type OFET and the second OFET can serve in the logical gate as a resistor.

According to one embodiment, the first OFET has an extremely thin semi-conducting layer or a negative threshold voltage.

According to another embodiment the logical gate comprises first and second OFETs each having an extremely thin semi-conducting layer or a negative threshold voltage.

According to a further embodiment, the second OFET without gate potential in the logical gate has OFF currents that are only approximately one order of magnitude lower than the ON currents so that the second OFET can be switched off by applying a positive gate potential.

According to one embodiment, the logical gate comprises at least four OFETs (cf FIG. 6).

According to another embodiment, the logical gate 2 has data lines (input and output), which have different potentials. By an "OFET that can serve in the gate as a resistor" is meant in this case either an OFET which has an extremely thin organic semi-conducting layer (ca from 5 to 30 nm) or an OFET in which the conductivity of the organic semi-conducting layer is reduced by special treatment (for example hydrazine treatment and/or special oxidation) such that the OFF currents are lower than the ON currents by only approximately one order of magnitude.

The "OFF current" is the current which flows when there is no potential between the gate electrode and the source electrode and the "ON current" (for p-type OFETs) is the current which flows when there is a negative potential difference between the gate electrode and the source electrode.

By a "classical resistor" we mean here a component having a linear current-voltage curve.

The invention is explained in greater detail below with reference to the drawings.

BRIEF DESCRIPTION OF THE DRAWINGS

FIGS. 1 and 2 shows the prior art

FIG. 1-7 shows an embodiment of the present invention

Figure 5:
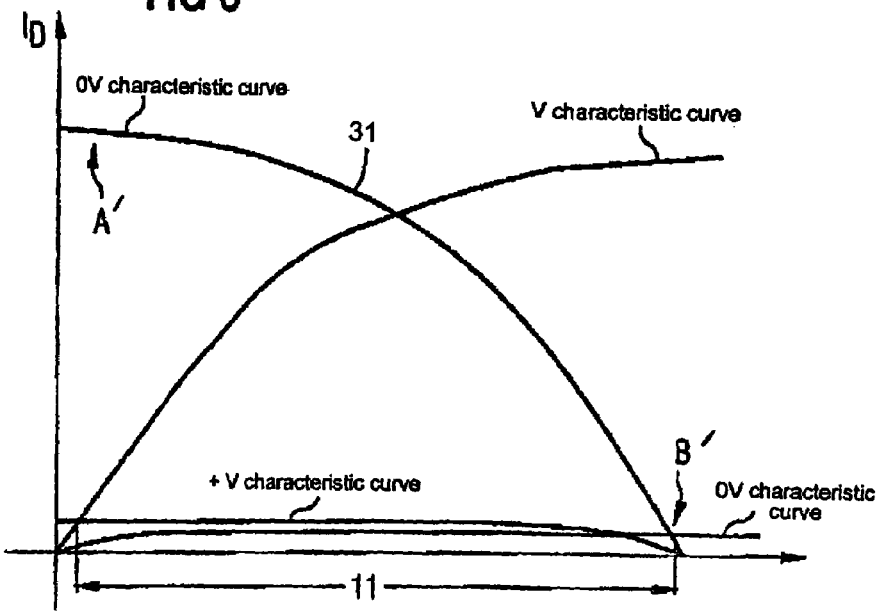

When a classical resistor is used (cf FIGS. 1 and 2, prior art) the logical gates switch either too slowly (FIG. 1) or cannot be switched off(FIG. 2).

FIG. 1 depicts a current-voltage diagram showing the ON curve 1 and the OFF curve 2. These characteristic curves correspond to the switched-on and the switched-off states respectively. The points of intersection 3 and 4 of the curves with the resistance curve 5 correspond to the switching points of the inverter. The output voltage swing 6 of the inverter is very large, which means that the inverter can be readily switched on and off. However, the switching currents 7 and 8 are different (the shaded areas below the curves correspond to the switching current). This means that the inverter can be quickly switched to "high" but only slowly to "low".

FIG. 2 again shows the prior art, the second case thereof, in which although the switching currents 9 and 10 are of an equal order of magnitude the voltage level difference 11 is too small. As a result, the corresponding inverter cannot be fully switched off.

FIG. 3 finally shows a current-voltage curve of a logical gate of the invention.

The current voltage diagram of a logical gate such as is shown in FIG. 3 comprises at least one OFET with an extremely thin semi-conducting layer as substitute for a classical resistor.

Due to an observed but not fully explained effect (very early saturation by reason of a very thin semiconductor layer or a negative threshold voltage), OFETs having extremely thin semi-conducting layers of from 5 to 30 nm, preferably from 7 to 25 nm, and more preferably from 10 to 20 nm have a specific output characteristic field as shown diagrammatically in FIG. 3.

The voltage level difference 12 is large enough to make it possible to completely switch off the inverter and the switching currents 13 and 14 are identical in size so that the inverter can switch quickly. Another advantage is the value of the switching current, which is very high on this type of transistor. Due to the thin semi-conducting layers, the transistors pass from the rising edge 15 very steeply into the saturation region 16. This behavior of the output characteristic makes it possible to construct logical circuits in conventional p-type MOS technology which show large charging voltages. As a result, the switching speed of the components is high. The purpose of the invention is to utilize this effect for the production of fast logical gates. These gates are fast and can at the same time be easily switch off, despite the use of conventional p-type MOS technology.

The replacement of the classical resistor can alternatively be accomplished by special treatment of the semi-conducting layer of an OFET and the use of a special circuit layout for the logic devices.

Typical OFETs have very low OFF currents when operated without gate potential.

Special treatment of the organic semi-conductor can cause the OFF currents to be only approximately one order of magnitude lower than the ON currents (for example by hydrazine treatment or by special oxidation). These particular OFETs can then still be switched off by the application of a positive gate potential. This provides an OFET that can be switched on by a negative gate potential and switched off by a positive gate potential (like an n-type transistor). This effect is utilized by the invention (in addition to the aforementioned effect arising from extremely thin semi-conducting layers), in order to produce fast logic devices. The basic element of these logic devices is the connection of at least two OFETs in series of which the flow channels are of different dimensions such that without a gate potential the flow channel of one of the OFETs is distinctly more conductive than that of the other OFET. As a result, the supply voltage applied to the two flow channels only drops in the case of the less conductive flow channel.

Switching takes place by the application of a negative gate potential to the OFET having the less conductive flow channel and the simultaneous application of a positive gate potential to the OFET having the more conductive flow channel.

FIG. 5 shows the current voltage diagram of such a logical gate. In FIG. 5, the 0 V characteristic curve 31 illustrates a first point A' at high current corresponding to the currents in the OFET transistors $A_1$, $A_2$, FIG. 6 and a second point B' at a low current corresponding to the low currents in the OFET transistors $B_1$, $B_2$ FIG. 6. Due to the special circuit layout or the special circuit layout in conjunction with a treatment of the semi-conducting layer, both characteristic curves are subjected to a shift, which results in a high voltage level difference and at the same time a high switching current. An inverter comprises two of these basic elements, i.e., it has at least four transistors. The switching operation of the inverter is achieved by switching on two of the transistors, e.g., OFET transistors $A_1$, $A_2$ and at the same time switching off the other two, e.g., OFET transistors $B_1$ and $B_2$.

Figure 6:
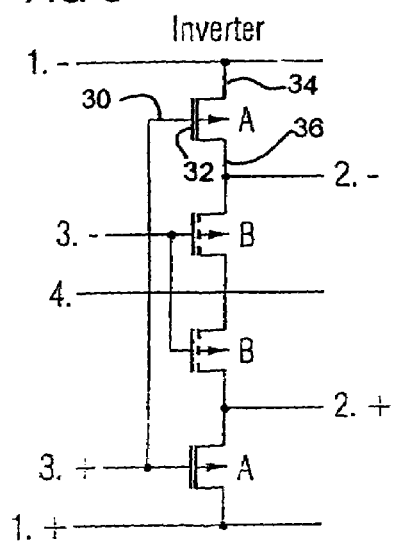
Figure 7:
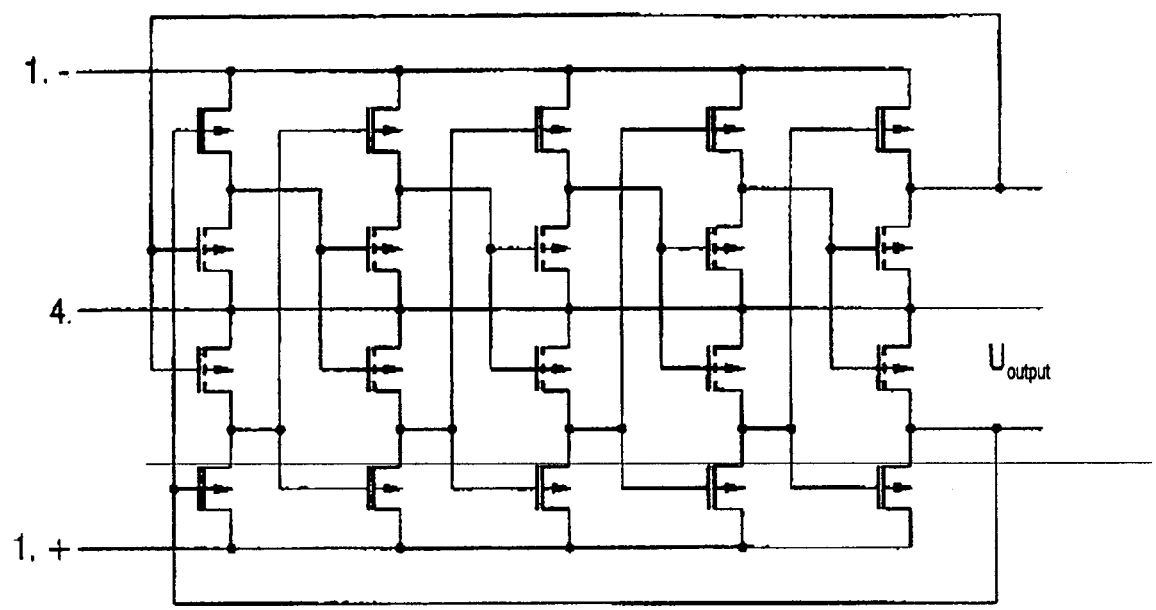

The invention is explained below with reference to a number of embodiments:

First of all we will deal with two embodiments relating to the current voltage diagram shown in FIG. 5:

FIG. 6 shows the circuit of an inverter and FIG. 7 the circuit of a ring oscillator. In order to obtain logically functional components, two pairs of transistors are required, since a positive voltage is required to switch off one transistor and at the same time a negative voltage to switch on the other. In order to obtain these different voltages, two of the aforementioned basic elements are interconnected such that one will provide a positive voltage at its output and the other a negative voltage. An inverter based on this novel circuit technology thus has two inputs and two outputs, the potential at the outputs of each will be zero (0V) or a positive or negative voltage (+/−V).

In FIG. 6, an inverter circuit is shown comprising four series connected OFET transistors $A_1$, $A_2$, $B_1$ and $B_2$. Representative transistor $A_1$ comprises a semiconductor layer 32, a gate electrode 30, a drain electrode 34 and a source electrode 36 all supported on a substrate (not shown). The other transistors A2, B1 and B2 are constructed similarly. The drain/source electrodes are connected in series as shown. FIG. 6 shows the inverter embodiment, in which the circuitry is an important factor. The supply voltage is available at point 1, which in this case is +/−V. Point 4 is the ground connection. The gate electrodes receive the applied switching signals at the points denoted by 3 which symbolize the inputs and the junction between the respective source and drain electrodes of adjacent transistors such as transistors $A_1$, $B_1$ are those denoted by points 2 which symbolize the outputs of the inverter. Logical "low" is achieved when no potential is available at the outputs 2. Logical "high" means that +/−V are available at the output 2 of the inverter. That is to say, the data line comprises two lines, on which different potentials are available.

C-type MOSs use an input which is split, but the potential is the same after splitting.

Unlike the aforementioned inverter, which has at least four OFETs, a conventional c-type MOS inverter, for example, consists of two transistors. When there is 0V at the input, transistor 1 is conductive and the other, 2, is non-conductive (the supply voltage thus drops at 2). When there is a negative potential, 1 will be non-conductive and 2 will be conductive (the supply voltage is thus available at 1)

FIG. 7 shows a ring oscillator. For this circuit an uneven number of inverters are interconnected by connecting the output of one to the input of the next inverter. The last inverter is then connected in like fashion to the first inverter so as to form a ring. The purpose of a ring oscillator is to allow the signal to pass continuously through the ring by constant switching of the succeeding inverter.

FIG. 4 shows some embodiments of the logic components comprising OFETs having extremely thin semi-conducting layers:

Inverter 22, NOT-OR 23, NOT-AND 24, ring oscillator 25. The graphical symbol 21 symbolizes a p-type OFET.

An inverter 22 can be a transistor connected to a resistor. A signal ("high" or "low") applied to the input is reversed (inverted) and then made available at the output (as "low" or "high"). In order to obtain a logical NOT-OR, two transistors can be connected in parallel. The states are passed on to the output by the application of an input voltage according to the table "low "="0 "; "high "="1 "). A NOT-AND can be realized in analogous manner by connecting the transistors in series.

Another embodiment (not shown) is a logical gate, eg, a flip-flop, which could be formed from these OFETs.

Advantageously, the logical gates are produced by (spray) coating, knife coating, printing or some other manufacturing process, which may be carried out as a continuous process.

The invention makes it possible, for the first time, to produce, despite conventional p-type MOS technology, fast logical gates built up of organic field effect transistors. This is primarily due to the early saturation effect of OFETs having very thin semi-conducting layers, and, furthermore, to the use of OFETs having specific properties as the organic logic components and to a novel layout of the circuit containing these logic components.

The invention claimed is:

1. A logic gate, comprising:
at least one first and one second interconnected organic field effect transistor (OFET) forming said logic gate, each OFET transistor including an organic semi-conductor layer, said at least one first and at least one second OFET each including a gate, of which transistors said at least one first and one second OFET are each a p-type OFET, said at least one second OFET having an organic semi-conductor layer exhibiting a thickness sufficiently thin that reduces the conductivity of this layer so that said organic semiconductor layer serves as a resistor of such an increased value in the logic gate or, wherein, the at least one second OFET semi-conductor layer is treated to reduce its conductivity to a value that is equivalent of the conductivity of said sufficiently thin organic semiconductor layer such that the reduction in conductivity of the organic semi-conductor layer of said at least one second OFET and the corresponding increase in the resistance of said organic semi-conductor layer of said at least one second OFET due to the reduced conductivity is such that said at least one second OFET without a gate potential exhibits OFF currents that are approximately one order of magnitude lower than the ON currents of the first OFET so that said at least one second OFET is switched off by an applied positive gate potential and switched on by an applied negative gate potential.

2. The logic gate as defined in claim 1, in which said first OFET semi-conductor layer has a thickness of from about 5 to about 30 nm.

3. The logic gate as defined in claim 1, wherein the organic semi-conductor layer of said first and second OFETs each have a thickness of from about 5 to about 30 nm.

4. The logic gate as defined in claim 1 which comprises at least four of said OFETs.

5. The logic gate as defined in claim 2 which comprises at least four of said OFETs.

6. The logic gate as defined in claim 3 which comprises at least four of said OFETs.

7. The logic gate as defined in any one of the previous claims having two data lines forming a respective input and an output, summing up to four data lines total, and which have different potentials.

8. The logic gate as defined in claim 1, in which said first OFET organic semi-conducting layer has a negative threshold voltage.

9. The logic gate as defined in claim 1, wherein the organic semiconducting layer of said first and second OFETs each have a negative threshold voltage.

* * * * *